United States Patent [19]
Shue et al.

[11] Patent Number: 5,744,395
[45] Date of Patent: Apr. 28, 1998

[54] LOW RESISTANCE, SELF-ALIGNED, TITANIUM SILICIDE STRUCTURES, USING A SINGLE RAPID THERMAL ANNEAL PROCEDURE

[75] Inventors: Shau-Lin Shue; Chen-Hua Douglas Yu, both of Hsin-chu, Taiwan

[73] Assignee: Taiwan Semiconductor Manufacturing Company, Ltd., Hsin-Chu, Taiwan

[21] Appl. No.: 730,384

[22] Filed: Oct. 16, 1996

[51] Int. Cl.[6] .................................................. H01L 21/336
[52] U.S. Cl. ........................ 438/305; 438/592; 438/694; 438/683
[58] Field of Search ..................................... 438/303, 586, 438/592, 664, 683, 902, 230, 231, 233, 299, 585, 595, 649, 656, 682, 352, 360, 305

[56] References Cited

U.S. PATENT DOCUMENTS

| | | |
|---|---|---|
| 4,885,259 | 12/1989 | Osinski et al. ........................ 437/41 |
| 5,196,360 | 3/1993 | Doan et al. ............................ 438/664 |
| 5,322,809 | 6/1994 | Moslehi ................................. 437/41 |
| 5,550,084 | 8/1996 | Anjum et al. ......................... 438/683 |
| 5,576,244 | 11/1996 | Hayashi et al. ....................... 438/586 |
| 5,593,924 | 1/1997 | Apte et al. . |
| 5,665,640 | 9/1997 | Foster et al. .......................... 438/680 |

*Primary Examiner*—T. N. Quach
*Attorney, Agent, or Firm*—George O. Saile; Stephen B. Ackerman

[57] ABSTRACT

A process for forming narrow polycide gate structures, using a low resistance, titanium silicide layer, has been developed. The process features initially forming a high resistance, titanium silicide layer, on exposed silicon regions, formed during the high temperature, PECVD titanium procedure. After deposition of a titanium nitride layer, used to protect the underlying high resistance, titanium silicide layer from a subsequent one step RTA anneal procedure, which is next performed [one step RTA anneal is then used] to convert the high resistance titanium silicide layer to a lower resistance titanium silicide layer. A composite insulator spacer is also used to reduce possible metal, or silicide bridging phenomena.

22 Claims, 4 Drawing Sheets

LOW RESISTANCE, SELF-ALIGNED, TITANIUM SILICIDE STRUCTURES, USING A SINGLE RAPID THERMAL ANNEAL PROCEDURE

BACKGROUND OF THE INVENTION (1) Field of the Invention

The present invention relates to the processes used to fabricate metal oxide semiconductor field effect transistors, (MOSFET), devices, and more specifically to a process used to create a MOSFET gate structure, using an improved titanium silicide formation procedure.

(2) Description of Prior Art

The semiconductor industry is continually striving to improve the performance of MOSFET devices, while still attempting to reduce the cost of semiconductor chips, comprised of these same MOSFET devices. The ability to create devices with sub-micron features, or micro-miniaturazation, has allowed these objectives, performance and cost, to be realized. Sub-micron features, in MOSFET devices, result in decreases in performance degrading, parasitic capacitances. Sub-micron features also allow smaller semiconductor chips to be fabricated, however with circuit densities comparable to larger chips, which were fabricated using larger features. The use of the smaller semiconductor chip thus allows more chips to be obtained from a specific size starting substrate, thus reducing the processing cost of a specific semiconductor chip.

Micro-miniaturazation has been achieved via advances in several semiconductor fabrication disciplines, specifically photolithography and dry etching. More advanced exposure cameras, as well as the use of more sensitive photoresist materials, have allowed sub-micron images to be routinely obtained in photoresist layers. In addition the development of more advanced dry etching tools and processes have allowed these sub-micron images in photoresist layers to be successfully transferred to underlying materials, used for construction of advanced MOSFET devices. However as specific features of MOSFET devices dramatically decrease in size, special attention must be assigned to areas in which performance can be degraded due to increased resistance, now encountered with the smaller features.

Very narrow MOSFET devices, with sub-half micron channel lengths, demand sub-half micron gate structures. To reduce the resistance of narrow MOSFET gate structures, the industry has been using a metal silicide layer, overlying a polysilicon gate, this gate structure, metal silicide-polysilicon, is referred to as a polycide gate structure. The low resistance metal silicide layer, offers improved conductivity of the polycide structure, when compared to a non-silicided, polysilicon gate structure. The metal silicide layer is usually formed after MOSFET source and drain processing, and is usually formed via deposition of a metal layer, annealing to convert the metal layer to the metal silicide layer in regions where the metal layer overlaid exposed silicon, that is on the source and drain regions, as well as on the top surface of the polysilicon gate structure. Unreacted metal, overlying non-silicon regions, such as insulator sidewall spacers on the polysilicon gate structure, as well as on field oxide regions, is selectively removed via wet chemical etching procedures. This process, for forming metal silicide only on silicon surfaces, is referred to as a SALICIDE, (Self-ALigned silICIDE) process.

One specific salicide process, routinely used in advanced MOSFET devices, is the creation of a titanium silicide-polysilicon, polycide gate structure. This is accomplished by the deposition of titanium, via use of either sputtering or chemical vapor deposition, (CVD), procedures, an anneal, using either conventional furnace techniques or rapid thermal annealing, and removal of the unreacted titanium. The objectives of the salicide procedure are to minimize titanium silicide resistivity, while still being able to remove the unreacted titanium from the non-silicon regions. Optimization of the anneal process, used to reduce titanium silicide resistance, sometimes can lead to bridging, or the formation of titanium silicide ribbons on the insulator sidewall spacers, resulting in shorts or leakage between the polycide gate and the source and drain regions. This invention will describe a process in which the objective of low silicide resistivity, and reduced risk of silicide bridging, are realized. In addition the process described in this invention results in a reduction in the level of anneal cycles needed to create the lowest resistivity of silicide. Prior art, such as Osinski, in U.S. Pat. No. 4,885,259, as well as Moshelhi, in U.S. Pat. No. 5,322,809, describe methods for salicide formation, but not the improved process described in this application.

SUMMARY OF THE INVENTION

It is an object of this invention to fabricate narrow channel length, MOSFET devices, using a polycide structure, comprised of an overlying, low resistance, titanium silicide layer and an underlying polysilicon gate structure.

It is another object of this invention to use a composite insulator spacer on the sides of the polysilicon gate structure, comprised of an overlying silicon nitride spacer and an underlying silicon dioxide spacer.

It is yet another object of this invention to form the high resistance, metastable phase of titanium silicide, on exposed silicon regions, during the high temperature, chemical vapor deposition, (CVD) of titanium, using $TiCl_4$ as a source.

It is still yet another object of this invention to use a single rapid thermal anneal cycle to convert the high resistance metastable phase of titanium silicide to a lower resistance, titanium silicide layer.

In accordance with the present invention a method is described for fabricating a MOSFET device, with a polycide structure, that uses a low resistance titanium silicide layer, created via high temperature, CVD deposition of titanium, and a single rapid thermal anneal cycle. After creation of isolating field oxide regions and P well formation, a gate insulator layer is thermally grown. Polysilicon deposition, doping procedures, and patterning are used to create a polysilicon gate structure. Lightly doped source and drain regions, followed by the creation of a composite insulator spacer, comprised of an overlying silicon nitride spacer and an underlying silicon dioxide spacer, are next formed. Heavily doped source and drain regions are then created, followed by the high temperature, CVD deposition of titanium, using titanium chloride as a source. The high temperature, CVD deposition of titanium results in the formation of a moderately high resistance, metastable phase of titanium silicide on exposed silicon regions, while unreacted titanium remains on insulator surfaces. A layer of titanium nitride is next deposited followed by a rapid thermal anneal cycle, used to convert the high resistance, metastable phase of titanium silicide, to a lower resistance, titanium silicide layer. A selective wet etch is then performed to remove titanium nitride, as well as unreacted titanium, resulting in silicided source and drain regions, as well as a polycide structure, consisting of low resistance, titanium silicide on an underlying polysilicon gate structure. The silicon nitride spacer, of the composite insulator spacer, is next removed, reducing the risk of leakage due to possible titanium silicide ribbons. Interlevel dielectric deposition, contact hole patterning, and the creation of metal contact structures to the source and drain regions, and to the polycide gate structure, are performed.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming a MOSFET device, with a low resistance, self-aligned, metal silicide gate, using a one step rapid thermal anneal cycle to form the silicide, will now be described in detail. This invention will describe this novel process for forming a low resistance metal silicide for an N channel, (NFET), MOSFET device. However the identical process for forming low resistance silicides can be applied to P channel, (PFET), complimentary, (CMOS), devices, or to bipolar-CMOS, (BiCMOS), devices.

Figure 1:
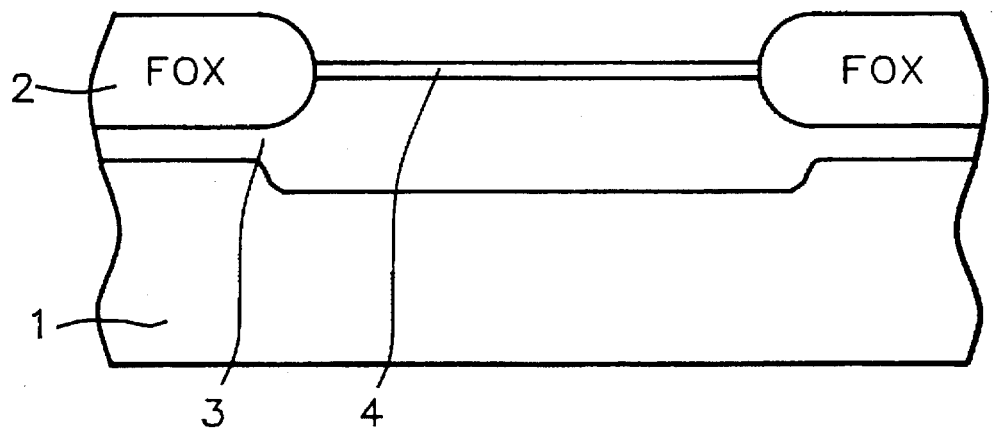
FIGS. 1–8, which schematically describe, in cross-sectional style, the key fabrication stages of a MOSFET device, featuring a low resistance, self-aligned, metal silicide, gate structure.

A P type, single crystalline, semiconductor substrate, 1, having a <100> crystallographic orientation, is used and shown schematically in FIG. 1. Field oxide regions, 2, (FOX), used for isolation purposes, are next formed. Briefly the method used to create FOX regions, 2, are to initially form the desired pattern for the device region in a oxidation resistant, composite insulator mask of silicon nitride-silicon dioxide. A thermal oxidation, at a temperature between about 850° to 1050° C., in an oxygen-steam ambient, is performed, to produce between about 3000 to 6000 Angstroms of FOX, 2, in the non-device regions, or in regions not protected by the oxidation resistant, composite insulator mask. The silicon nitride layer, of the composite insulator mask, is then removed using a hot phosphoric acid solution. A P well region, 3, is next created via ion implantation of boron. P well region, 3, different in resistivity then P type semiconductor, 1, is used achieve the desired N channel, MOSFET characteristics. After completion of the P well ion implantation procedure, the underlying silicon dioxide layer, of the composite insulator mask, is removed via use of a buffered hydrofluoric acid solution, followed by additional wet cleans. A gate insulator layer, 4, of silicon dioxide, is then thermally grown in an oxygen-steam ambient, at a temperature between about 850° to 1000° C., to a thickness between about 30 to 200 Angstroms. The result of these processing steps are schematically shown in FIG. 1.

Figure 2:
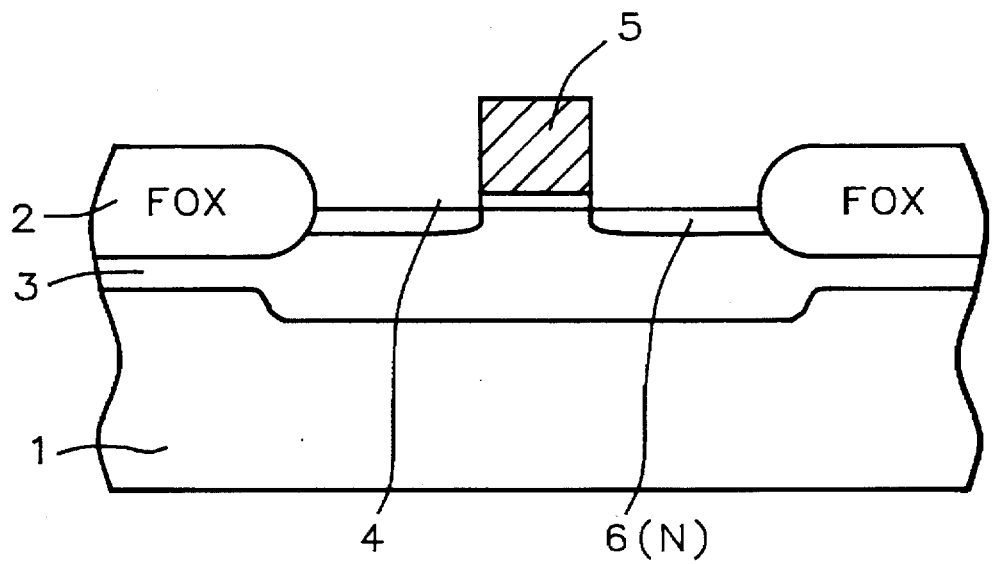

A polysilicon layer is next deposited using low pressure chemical vapor deposition, (LPCVD), procedures, at a temperature between about 500° to 700° C., to a thickness between about 1500 to 4000 Angstroms. The polysilicon layer can either be grown intrinsically, and doped via ion implantation of either arsenic or phosphorous, at an energy between about 25 to 75 KeV, at a dose between about 1E14 to 1E16 atoms/cm², or the polysilicon layer can be grown using in-situ doping procedures, via the addition of either arsine or phosphine, to the silane ambient. Patterning of the polysilicon layer is accomplished via photolithographic, and anisotropic, reactive ion etching, (RIE), procedures, using $Cl_2$ as an etchant for polysilicon, creating a narrow polysilicon gate structure, 5, with a width between about 0.01 to 0.35 μM, and schematically shown in FIG. 2. After photoresist removal, via the use of plasma oxygen ashing procedures, followed by careful wet cleans, a lightly doped source and drain region, 6, is formed via ion implantation of phosphorous. This is schematically shown in FIG. 2.

Figure 3:
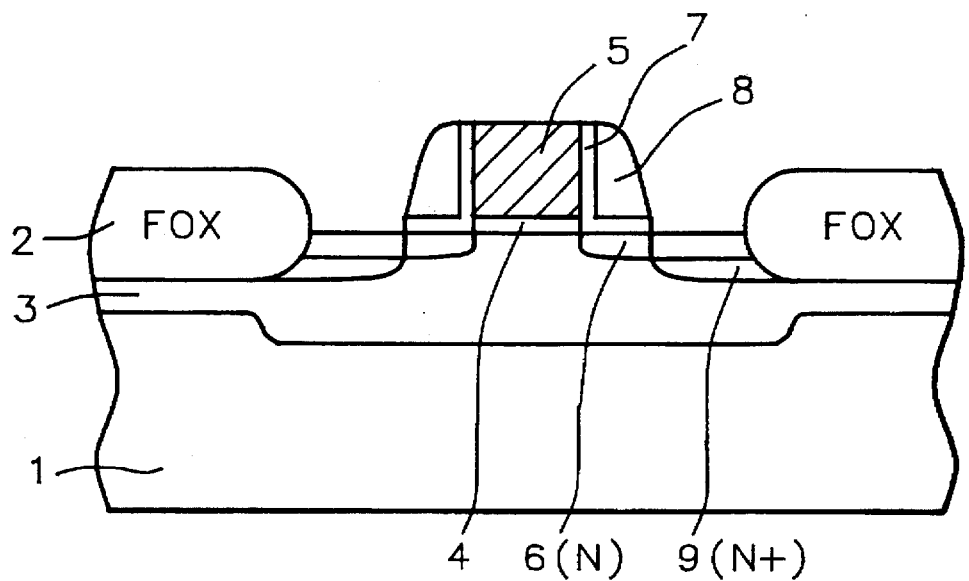

A composite insulator spacer, comprised of dual dielectric layers, is next addressed. A layer of silicon oxide, 7, obtained via LPCVD, is deposited at a temperature between about 600° to 800° C., to a thickness between about 1000 to 2500 Angstroms, followed by the deposition of an overlying silicon nitride layer, 8, again deposited using LPCVD procedures, at a temperature between about 700° to 900° C., to a thickness between about 1000 to 2500 Angstroms. An anisotropic, RIE procedure, using $CHF_3$ as an etchant, is used to create the composite insulator spacer of silicon nitride, 8-silicon oxide, 7, shown schematically in FIG. 3. A heavily doped source and drain region, 9, shown schematically in FIG. 3, is next created via ion implantation of arsenic.

Figure 4:
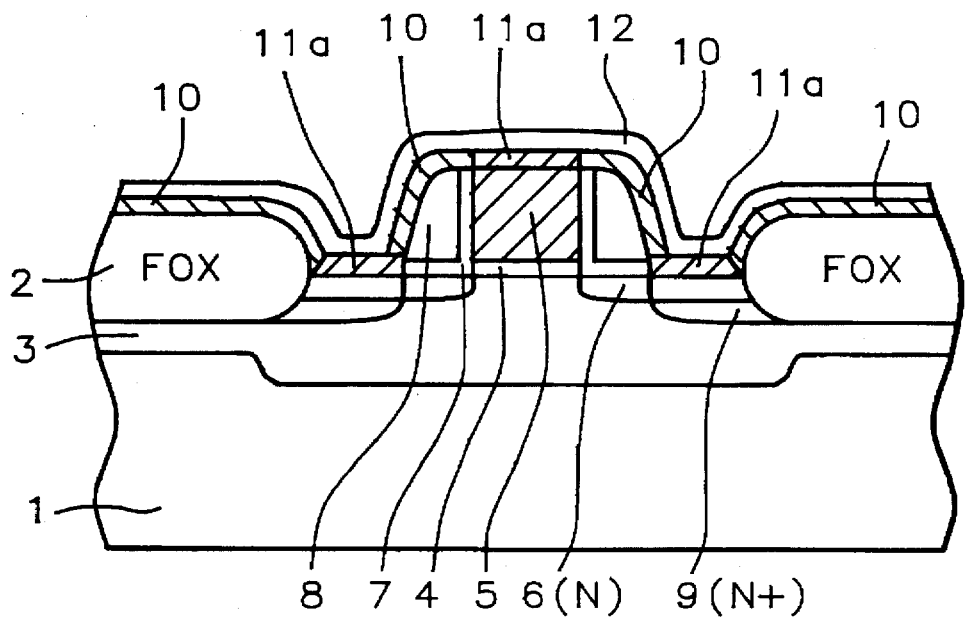

The critical part of this invention, the creation of the low resistance, self-aligned, metal silicide layer, is now addressed. Careful surface preparations, using a hydrofluoric acid dip and a sputter etch procedure, in an argon ambient, are performed to remove contaminants, including native oxides from the surface of source and drain regions, as well as from the top surface of polysilicon gate structure, 5, prior to the deposition of titanium. A CVD deposition of a titanium layer, 10, is now performed, at a temperature between about 400° to 700° C., to a thickness between about 100 to 400 Angstroms, using $TiCl_4$ as a source. At this deposition temperature the titanium, deposited on exposed silicon surfaces, heavily doped source and drain region, 9, and the top surface of the polysilicon gate structure, 5, forms a layer of a metastable phase of titanium silicide, 11a, sometimes referred to as the C49 phase of titanium silicide, with a thickness between about 100 to 900 Angstroms. Titanium layer, 10, remains unreacted in regions in which it overlays insulator material, such as silicon nitride spacer, 8, as well as FOX regions, 2. A TiN layer, 12, is next deposited, using CVD or plasma vapor deposition, (PVD), procedures, to a thickness between about 100 to 500 Angstroms. The result of these procedures are schematically illustrated in FIG. 4.

Figure 5:
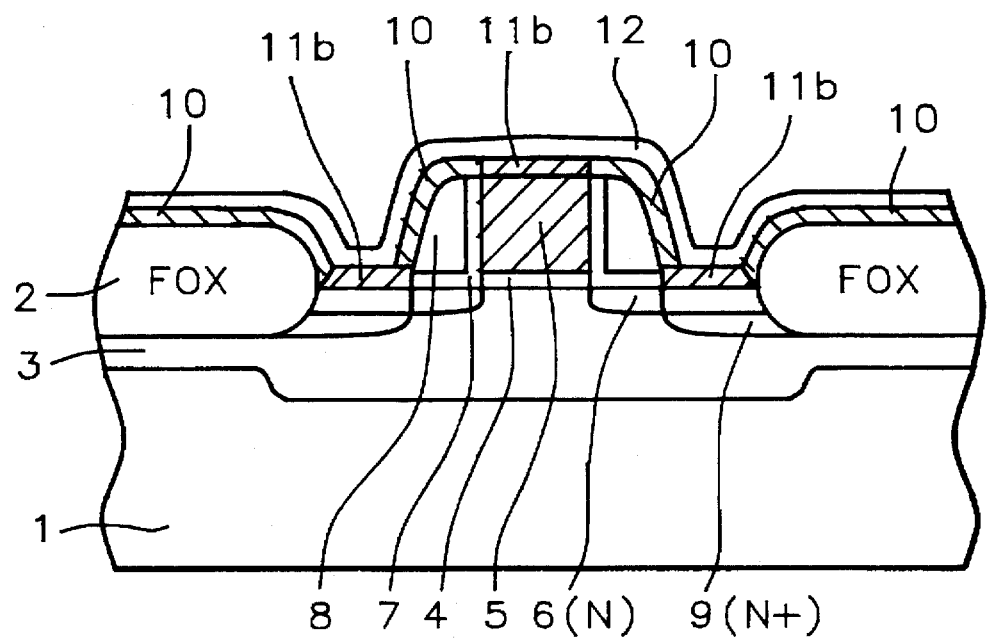
Figure 6:
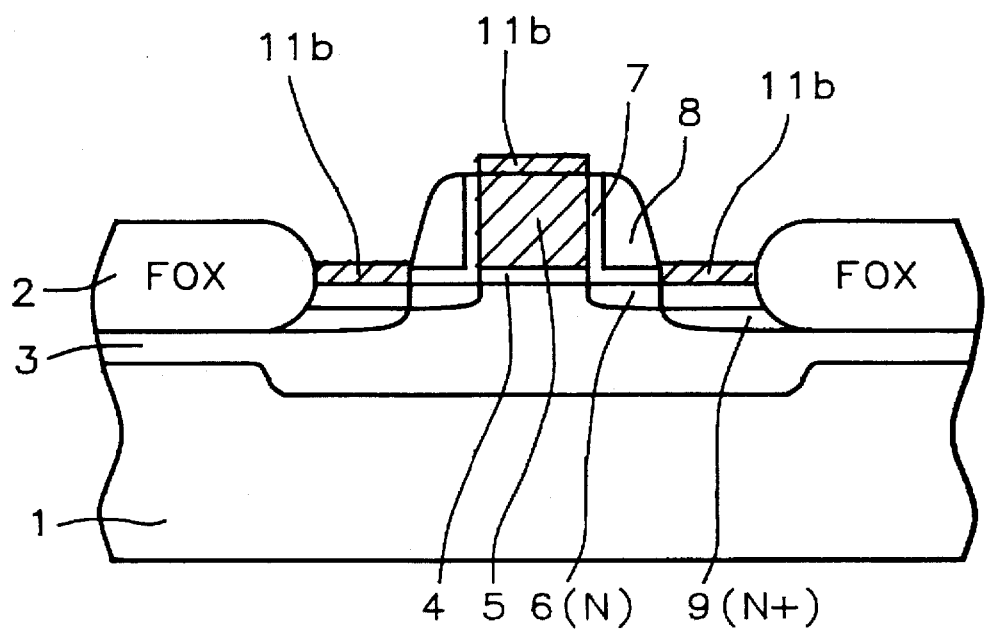

The metastable phase of titanium silicide layer, 11a, has a resistivity between about 50 to 250 u-ohm-cm., and is now converted to a low resistance phase of titanium silicide, 11b, via a one step rapid thermal anneal, (RTA), procedure. This is accomplished using a RTA procedure, at a temperature between about 650° to 900° C., for a time between about 20 to 90 sec., in a nitrogen ambient. TiN layer, 12, protects the titanium silicide layer from exposure to oxygen and possible reaction. The low resistance phase of titanium silicide, 11b, sometimes referred to as C54 phase of titanium silicide, has a sheet resistance between about 12 to 45 u-ohm-cm. This is shown schematically in FIG. 5. Removal of TiN layer, 12, as well as removal of unreacted titanium layer, 10, is next accomplished via use of a solution of $NH_4OH$—$H_2O_2$—$H_2O$. This solution selectively removes TiN and titanium, without attacking titanium silicide layer, 11b, thus resulting in titanium silicide, self-aligned, to the polysilicon gate structure, 5. The polycide structure, (titanium silicide, 11b, on underlying polysilicon gate structure, 5), is referred to as salicide, (Self-ALigned silICIDE).

The complete removal of titanium layer, 10, from the surface of the composite insulator spacer, is imperative to avoid a bridging phenomena, or electrical leakage paths between the polycide structure and source and drain regions.

Figure 7:
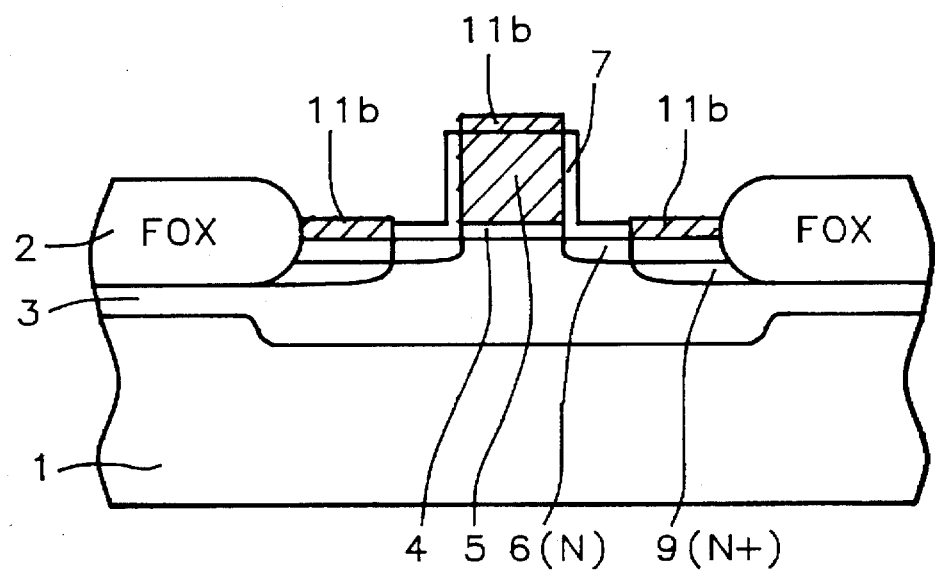

The composite spacer, used in this invention adds the insurance needed to avoid the bridging mechanism. Removal of the silicon nitride, 8, component of the composite insulator spacer, via use of $H_3PO_4$, at a temperature between about 140° to 200° C., also results in lifting off any titanium layer, 10, residuals, that may not have been previously removed in the $NH_4OH$—$H_2O_2$—$H_2O$ solution. This is schematically shown in FIG. 7.

Figure 8:
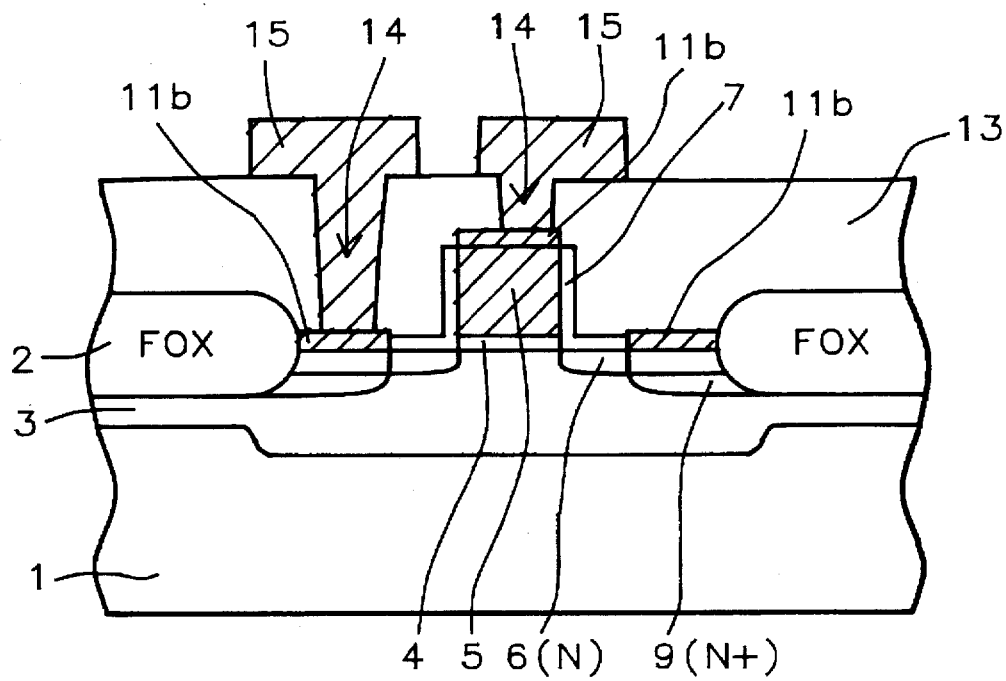

The MOSFET structure is completed by forming metal contact structures to active device elements. First a silicon oxide layer, 13, is deposited to a thickness between about 7000 to 10000 Angstroms. Contact holes, 14, are formed in silicon oxide layer, 13, via use of standard photolithographic and RIE procedures. After removal of photoresist via plasma oxygen ashing and careful wet cleans, a layer of aluminum, containing between about 0.5 to 4.0% copper, is deposited using r.f. sputtering, to a thickness between about 3500 to 7000 Angstroms. The metal line interconnects, 15, are formed via photolithographic patterning and etching, and shown schematically in FIG. 8.

While this invention has been particularly shown and described with reference to the preferred embodiments thereof, it will be understood by those skilled in the art that various changes in form and details may be made without departing from the spirit and scope of this invention.

What is claimed is:

1. A method of forming a MOSFET device, on a semiconductor substrate, in which the metal silicide, of a polycide gate structure, is formed during the deposition of a metal, and a one step RTA step, comprising the steps of:

forming field oxide regions in said semiconductor substrate;

ion implanting a first conductivity imparting dopant into said semiconductor substrate to create a P well region;

growing a gate insulator layer on areas of said semiconductor substrate, not covered by said field oxide regions;

depositing a polysilicon layer on said gate insulator layer and on said field oxide regions;

patterning of said polysilicon layer to form a polysilicon gate structure;

ion implanting a second conductivity imparting dopant into a region of said semiconductor substrate, not covered by said field oxide regions, and not covered by said polysilicon gate structure, to form lightly doped source and drain regions;

depositing a first insulator sidewall layer on said polysilicon gate structure, as well as on said field oxide regions, and on said lightly doped source and drain regions;

depositing a second insulator sidewall layer on said first sidewall insulator layer;

anisotropic RIE of said second insulator sidewall layer, and of said first insulator sidewall layer, to create a composite insulator spacer on the sides of said polysilicon gate structure, comprised of a second insulator spacer overlying a first insulator spacer;

ion implanting a third conductivity imparting dopant into a region of said semiconductor substrate, not covered by said polysilicon gate structure, not covered by said composite insulator spacer, and not covered by said field oxide region, to form heavily doped source and drain region;

depositing a metal layer at conditions in which a high resistance, metal silicide layer is formed on said heavily doped source and drain regions, and on top surface of said polysilicon gate structure, while said metal layer remains unreacted on surface of said field oxide regions, and on the surface of said composite insulator spacer;

depositing a titanium nitride layer on said high resistance, metal silicide layer, and on said metal layer;

effecting a one step rapid thermal anneal, converting said high resistance, metal silicide layer to a low resistance, metal silicide layer;

removing said titanium nitride layer, from the surface of said low resistance, metal silicide layer, and from the surface of said metal layer, and removing said metal layer from the surface of said composite insulator spacer, and from the surface of said field oxide regions, resulting in said polycide structure, comprised of said low resistance, metal silicide layer, overlying said polysilicon gate structure;

removing said second insulator spacer from said composite insulator spacer;

depositing an interlevel dielectric layer;

opening contact holes, in said interlevel dielectric layer, to said heavily doped source and drain regions, and to said polycide structure; and forming metal contacts to said heavily doped source and drain region, and to said polycide structure.

2. The method of claim 1, wherein said gate insulator layer is silicon dioxide, thermally grown in an oxygen-steam ambient, at a temperature between about 850° to 1000° C., to a thickness between about 50 to 200 Angstroms.

3. The method of claim 1, wherein said polysilicon layer is deposited using LPCVD procedures, at a temperature between about 500° to 700° C., to a thickness between about 1500 to 4000 Angstroms.

4. The method of claim 1, wherein said polysilicon gate structure is created via anisotropic, RIE procedures, using $Cl_2$ as an etchant, with the width of said polysilicon gate structure between about 0.01 to 0.35 µm.

5. The method of claim 1, wherein said first insulator sidewall layer is silicon oxide, deposited via LPCVD procedures, at a temperature between about 600° to 800° C., to a thickness between about 1000 to 2500 Angstroms.

6. The method of claim 1, wherein said second insulator sidewall layer is silicon nitride, deposited using LPCVD procedures, at a temperature between about 700° to 900° C., to a thickness between about 1000 to 2500 Angstroms.

7. The method of claim 1, wherein said composite insulator spacer is comprised of an overlying, said silicon nitride spacer and an underlying, said silicon oxide spacer, created via anisotropic, reactive ion etching of said second insulator sidewall layer, and of said first insulator sidewall layer, using $CHF_3$ as an etchant.

8. The method of claim 1, wherein said metal is titanium, deposited using PECVD procedures, at a temperature between about 400° to 700° C., to a thickness between about 100 to 400 Angstroms, using $TiCl_4$ as a source, and forming a high resistance, metal silicide layer of titanium silicide, with a resistivity between about 50 to 250 µ-ohm-cm, on exposed silicon regions.

9. The method of claim 1, wherein said TiN layer is deposited using PVD or CVD procedures, to a thickness between about 100 to 500 Angstroms.

10. The method of claim 1, wherein a one step rapid thermal anneal is performed at a temperature between about 650° to 900° C., for a time between about 20 to 90 sec., in a nitrogen ambient, converting high resistance metal silicide layer of titanium silicide, to a low resistance metal silicide layer of titanium silicide, having a resistivity between about 12 to 45 µ-ohm-cm.

11. The method of claim 1, wherein said TiN layer, and said metal layer of titanium, are removed using a solution of $NH_4OH$—$H_2O_2$—$H_2O$.

12. The method of claim 1, wherein silicon nitride spacer is removed using $H_3PO_4$ at a temperature between about 140° to 200° C.

13. A method of forming a MOSFET device, on a semiconductor substrate, in which a high resistance phase of the titanium silicide layer, used as part of a narrow width polycide gate structure, is formed during the deposition of a titanium layer, with said high resistance phase of titanium silicide layer, converted to a low resistance, titanium silicide phase, via a one step RTA procedure, comprising the steps of:

forming field oxide regions in said semiconductor substrate;

ion implanting a first conductivity imparting dopant into said semiconductor substrate, to create a P well region;

growing a gate insulator layer on areas of said semiconductor substrate, not covered by said field oxide regions;

depositing a polysilicon layer on said gate insulator layer, and on said field oxide regions;

patterning of said polysilicon layer to form a narrow polysilicon gate structure;

ion implanting a second conductivity imparting dopant into a region of said semiconductor substrate, not covered by said narrow polysilicon gate structure, and not covered by said field oxide region, to create a lightly doped source and drain region;

depositing a silicon oxide sidewall layer on said narrow polysilicon gate structure, on said lightly doped source and drain regions, and on said field oxide regions;

depositing a silicon nitride sidewall layer on said silicon oxide sidewall layer;

anisotropic RIE of said silicon nitride sidewall layer, and of said silicon oxide sidewall layer, to create a composite insulator spacer on the sides of said narrow polysilicon gate structure, comprised of a silicon nitride spacer overlying a silicon oxide spacer;

ion implanting a third conductivity imparting dopant into a region of said semiconductor substrate, not covered by said narrow polysilicon gate structure, not covered by said composite insulator spacer, and not covered by said field oxide regions;

depositing said titanium layer at conditions which create a high resistance, titanium silicide layer, on said heavily doped source and drain regions, and on top surface of said narrow polysilicon gate structure, while said titanium layer remains unreacted on the surface of said composite insulator spacer, and on said field oxide regions;

depositing a titanium nitride layer on said high resistance, titanium silicide layer, and on said titanium layer;

effecting a one step rapid thermal anneal, converting said high resistance, titanium silicide layer to a low resistance, titanium silicide layer;

removing said titanium nitride layer from the surface of said low resistance, titanium silicide layer, and from the surface of said titanium layer, and removing said titanium layer from the surface of said composite insulator spacer, and from the surface of said field oxide regions, resulting in said narrow width polycide structure, comprised of said low resistance, titanium silicide layer, overlying said narrow polysilicon gate structure;

removing said silicon nitride spacer from said composite insulator spacer;

depositing an interlevel dielectric layer;

opening contact holes, in said interlevel dielectric layer, to said heavily doped source and drain regions, and to said narrow width polycide structure; and forming metal contact structures to said heavily doped source and drain regions, and to said narrow width polycide structure.

14. The method of claim 13, wherein said gate insulator layer is silicon oxide, thermally grown in an oxygen-steam ambient, at a temperature between about 850° to 1000° C., to a thickness between about 50 to 200 Angstroms.

15. The method of claim 13, wherein said polysilicon layer is deposited using LPCVD procedures, at a temperature between about 500° to 700° C., to a thickness between about 1500 to 4000 Angstroms.

16. The method of claim 13, wherein said narrow polysilicon gate structure is created via anisotropic RIE procedures, using $Cl_2$ as an etchant, with said narrow polysilicon gate structure having a width between about 0.01 to 0.35 µM.

17. The method of claim 13, wherein said silicon oxide sidewall layer is deposited using LPCVD procedures, at a temperature between about 600° to 800° C., to a thickness between about 1000 to 2500 Angstroms.

18. The method of claim 13, wherein said silicon nitride sidewall layer is deposited using LPCVD procedures, at a temperature between about 700° to 900° C., to a thickness between about 1000 to 2500 Angstroms.

19. The method of claim 13, wherein said composite insulator spacer is comprised of said silicon nitride spacer, overlying said silicon oxide spacer, created via anisotropic RIE of said silicon nitride sidewall layer, and of said silicon oxide sidewall layer, using $CHF_3$ as an etchant.

20. The method of claim 13, wherein said titanium layer is deposited using PECVD procedures, at a temperature between about 400° to 700° C., to a thickness between about 100 to 400 Angstroms, using $TiCl_4$ as a source, and forming said high resistance, titanium silicide layer on exposed silicon regions, with a resistivity of between about 50 to 250 µ-ohm-cm.

21. The method of claim 13, wherein said titanium nitride layer is deposited using PCV or CVD procedures, to a thickness between about 200 to 400 Angstroms.

22. The method of claim 13, wherein a one step RTA procedure is performed at a temperature between about 650° to 900° C., for a time between about 20 to 90 sec., in an nitrogen ambient, converting said high resistance, titanium silicide layer to said low resistance, titanium silicide layer, with said low resistance, titanium silicide layer having a resistivity between about 12 to 45 µ-ohm-cm.

* * * * *